(12) United States Patent
Hijikata et al.

(10) Patent No.: US 9,119,300 B2
(45) Date of Patent: Aug. 25, 2015

(54) MOTOR CONTROL DEVICE

(71) Applicant: MINEBEA CO., LTD., Kitasaku-gun, Nagano (JP)

(72) Inventors: Hidetoshi Hijikata, Hamamatsu (JP); Takayuki Matsui, Toyohashi (JP); Kazuo Takada, Kosai (JP); Haruka Miyaji, Toyohashi (JP)

(73) Assignee: MINEBEA CO., LTD., Kitasaku-gun (JP)

( * ) Notice: Subject to any disclaimer, the term of this patent is extended or adjusted under 35 U.S.C. 154(b) by 231 days.

(21) Appl. No.: 13/718,473

(22) Filed: Dec. 18, 2012

(65) Prior Publication Data

US 2013/0194762 A1 Aug. 1, 2013

(30) Foreign Application Priority Data

Jan. 27, 2012 (JP) ................................. 2012-015534

(51) Int. Cl.
*H05K 1/02* (2006.01)
*H05K 1/14* (2006.01)

(52) U.S. Cl.
CPC .............. *H05K 1/0271* (2013.01); *H05K 1/028* (2013.01); *H05K 1/147* (2013.01); *H05K 1/0281* (2013.01); *H05K 2201/10204* (2013.01)

(58) Field of Classification Search
CPC ....................................................... H05K 1/147
USPC ........................................................... 361/749
See application file for complete search history.

(56) References Cited

U.S. PATENT DOCUMENTS

| | | | |
|---|---|---|---|
| 5,982,468 A * | 11/1999 | Satou et al. | 349/150 |
| 7,591,671 B2 * | 9/2009 | Kim et al. | 439/495 |
| 2003/0099182 A1 * | 5/2003 | Maeda et al. | 369/77.1 |
| 2005/0028624 A1 * | 2/2005 | Murakami et al. | 74/335 |
| 2006/0141816 A1 * | 6/2006 | Kitahori et al. | 439/67 |
| 2007/0177308 A1 * | 8/2007 | Kimura | 360/245.9 |
| 2008/0146051 A1 * | 6/2008 | Honda | 439/66 |
| 2008/0291653 A1 * | 11/2008 | Sailor et al. | 361/807 |

FOREIGN PATENT DOCUMENTS

JP A-8-213721 8/1996

* cited by examiner

*Primary Examiner* — William H Mayo, III
*Assistant Examiner* — Hiram E Gonzalez
(74) *Attorney, Agent, or Firm* — Oliff PLC

(57) ABSTRACT

A motor control device includes a circuit board having a control circuit controlling electric power to be supplied to a motor, a base fixedly supporting the circuit board, a flexible printed circuit supplying electric power to the motor, a pin terminal disposed on the circuit board, being electrically connected with the control circuit, a dummy pin terminal disposed on the circuit board, being electrically free from the control circuit, a wiring pattern land disposed on the FPC, being electrically connected with the pin terminal, and a dummy wiring pattern land disposed on the FPC, being connected with the dummy pin terminal.

6 Claims, 2 Drawing Sheets

MOTOR CONTROL DEVICE

TECHNICAL FIELD

The present invention relates to a motor control device for making connection between a motor and a motor control circuit.

BACKGROUND ART

Connection between a motor and a motor control circuit is made by connecting the motor with a control printed circuit board on which the motor control circuit is mounted. Here, for making connection between the motor and the control printed circuit board as a circuit board, a flexible printed circuit is used in many cases to reduce transfer of motor vibration to the control printed circuit board. Since the flexible printed circuit is securely connected to the control printed circuit board only at a soldered terminal portion in a mechanistic manner, the soldered portion tends to be subjected to any force when the flexible printed circuit is pulled due to motor vibration or external force application. Therefore, the soldered flexible printed circuit has been in danger of causing disconnection or fracture due to force applied in a direction of separating a copper wire or a copper foil, which is soldered on the terminal of the flexible printed circuit.

Various techniques, such as reinforcement fixation with adhesive tapes or adhesive agents, have been employed to prevent disconnection or fracture. However, in the case of using the adhesive tape, there are problems of an increase in cost for raw materials, an increase in cost for additional works such as stripping of release paper, generation of waste materials of release paper, and the like. Alternatively, in the case of using the adhesive agent, there are problems of unstable quality, difficulty in control of adhesive agents, time and facility requirements for dryness, tendency of the adhesive tape to adhere to an area other than adhesion-requiring areas, and the like.

A liquid crystal device disposed with a dummy terminal that does not participate in electric connection has been known to increase the connection reliability of a flexible printed circuit (see, for example, Japanese Unexamined Patent Application Publication No. 8-213721 (Patent Literature 1).

However, in Japanese Unexamined Patent Application Publication No. 8-213721 (Patent Literature 1), a thin-film dummy terminal printed on a flexible printed circuit is used. In this case, when more intense vibration, such as motor vibration, is applied to a connection portion compared with a liquid crystal device, the dummy terminal may be easily peeled off and then an electric connection terminal may be also peeled off. As a result, disconnection may occur.

SUMMARY OF INVENTION

1. Technical Program

An object of the present invention is to provide a motor control device that prevents an increase in cost and reduces disconnection failure.

2. Solution to Problem

In order to attain the aforementioned object, the present invention provides (1); a motor control device comprising a circuit board having a control circuit controlling electric power supplied to the motor; a base fixedly supporting the circuit board; a flexible printed circuit (FPC) supplying electric power to the motor; a pin terminal disposed on the circuit board, being electrically connected with the control circuit; a dummy pin terminal disposed on the circuit board, being electrically free from the control circuit; a wiring pattern land disposed on the FPC, being electrically connected with the pin terminal; and a dummy wiring pattern land disposed on the FPC, being connected to the dummy pin terminal.

The present invention also provides (2); the motor control device according to (1), wherein the dummy pin terminal and the dummy wiring pattern land may be disposed toward a side, where the FPC is drawn to the motor, than the pin terminal and the wiring pattern land, respectively.

The present invention also provides (3); the motor control device according to (1), wherein each of the dummy pin terminal and the dummy wiring pattern land may be disposed in plural and same number.

The present invention also provides (4); the motor control device according to any one of (1) to (3), wherein the dummy pin terminal and the dummy wiring pattern land may be disposed outward than the pin terminal and the wiring pattern land, respectively.

The present invention also provides (5); the motor control device according to any one of (1) to (4) may further comprises a FPC holder secured on the motor to hold one end of the FPC to be connected to the motor.

The present invention also provides (6); the motor control device according to any one of (1) to (5), wherein each of the pin terminal and the dummy pin terminal may be disposed on the base instead of the circuit board.

Advantageous Effects of Invention

According to the aforementioned motor control device, when making connection between a motor and a FPC connected to the motor, a dummy pin terminal and a dummy wiring pattern land are added in addition to preparing a pin terminal and a wiring pattern land. Both the dummy pin terminal and the dummy wiring pattern land are to disperse load from the FPC. Therefore, load on the pin terminal and the wiring pattern land can be reduced, and disconnection can be reduced.

DESCRIPTION OF EMBODIMENTS

Figure 1:
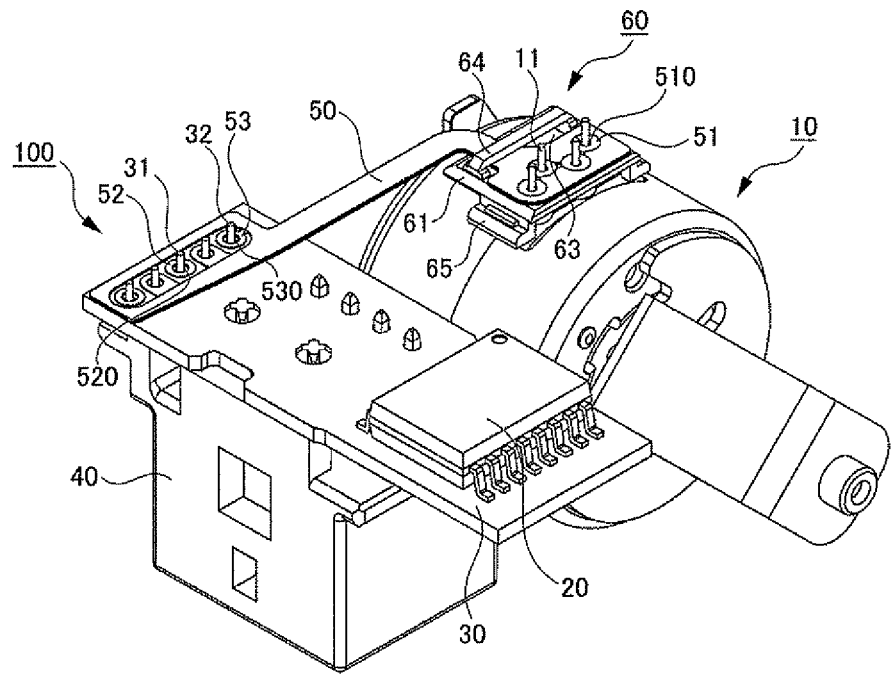
FIG. 1 is a perspective diagram illustrating a motor control device according to an embodiment.
Figure 2:
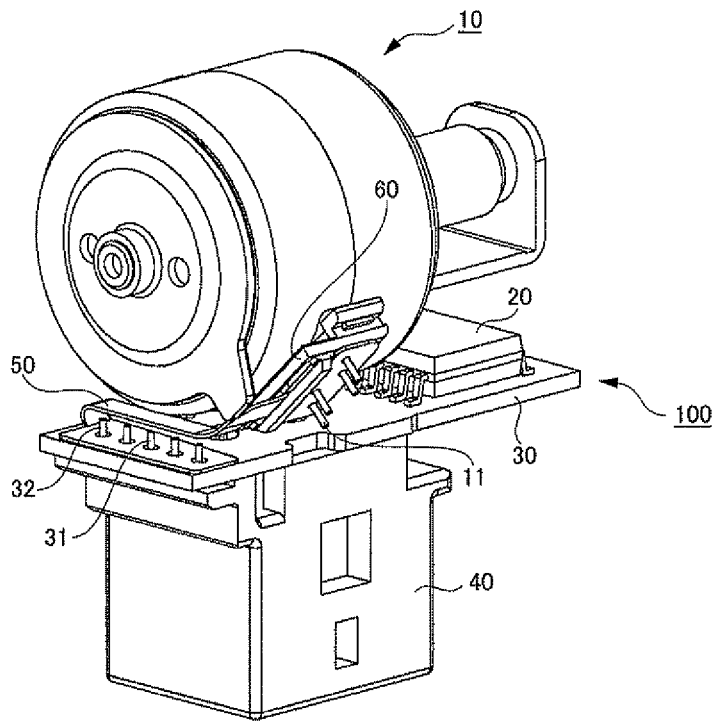
FIG. 2 is a perspective diagram illustrating an exemplary installation of the motor control device.

Hereinafter, an embodiment of a motor control device according to the present invention will be described in detail with reference to drawings. FIG. 1 is a perspective diagram illustrating a motor control device 100 of the embodiment. FIG. 2 is a perspective diagram illustrating an exemplary installation of the motor control device 100. In FIG. 1 and FIG. 2, the motor control device 100 comprises a circuit board 30 having a control circuit 20 controlling electric power supplied to a motor 10, a base 40 fixedly supporting the circuit board 30, a FPC 50 supplying electric power to the motor 10, and a FPC holder 60.

In FIG. 1, the FPC 50 electrically connects the motor 10 to the control circuit 20 through the circuit board 30 on which the control circuit 20 is mounted. Pin terminals 11, which electrically connect the motor 10 to a wiring pattern land 51 of the FPC 50, are disposed at four different positions on the motor 10.

Figure 3:
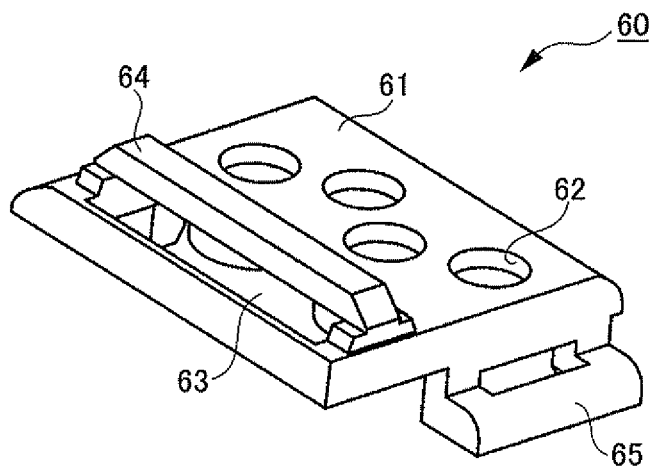
FIG. 3 is a perspective diagram illustrating a FPC holder.

Furthermore, one end of the FPC 50, which is on the side of the motor 10, is secured on the motor 10 via the FPC holder 60. The FPC holder 60 is illustrated in perspective in FIG. 3. In FIG. 3, the FPC holder 60 comprises a main body 61, terminal through-holes 62, an FPC through-hole 63, a bridging portion 64, and an engaging portion 65.

In FIG. 1 and FIG. 3, one end of the FPC 50, which is on the side of the motor 10, is inserted into the FPC through-hole 63 of the FPC holder 60 and mounted on the main body 61 of the FPC holder 60. An engaging portion 65 of the FPC holder 60 is secured on the motor 10 to hold the motor (10)'s side end of the FPC 50 in place so that its position relative to the motor 10 can be prevented from shifting by the bridging portion 64.

The pin terminals 11 of the motor 10 are individually inserted into terminal through-holes and then individually inserted into holes 510 formed in a wiring pattern land 51 of the FPC 50. The wiring pattern lands 51 and the pin terminals 11 are electrically connected to each other and secured by soldering, for example.

The control circuit 20 is mounted on one end of the circuit board 30 and electrically connected to wiring (not shown) disposed on the circuit board 30. The wiring is drawn to another end of the circuit board 30 and then brought into connection with four pin terminals 31 arranged in a row to electrically connect the wiring to wiring pattern lands 52 of the FPC 50. The circuit board 30 is secured on the base 40. Here, the base 40 may also serve as a connector that connects the circuit board 30 to an exterior.

The circuit board 30 further comprises a dummy pin terminal 32 which is lined up with four pin terminals 31 and located at one end of the line. Here, the dummy pin terminal 31 is arranged closer than the pin terminals 31 to a side where the FPC 50 is drawn to the motor 10. On the other hand, the wiring pattern lands 52 are formed in line on one end of the FPC 50, which is on a side of the circuit board 30. In addition, holes 520 are formed in the wiring pattern lands 52. A dummy wiring pattern land 53, which is electrically free from connection, is formed on an end of the lined up wiring pattern lands 52 on a side where the FPC 50 is drawn to the motor 10. A hole 530 is formed in the dummy wiring pattern lands 53.

The four pin terminals 31 are individually inserted into the holes 520 of the wiring pattern lands 52, while the dummy pin terminal 32 is inserted into the hole 530 of the dummy wiring pattern land 53. Therefore, the FPC 50 is drawn from a side where the dummy pin terminal 32 and the dummy wiring pattern land 53 are formed. The wiring pattern land 52 and the pin terminal 31 are electrically connected and secured with each other by soldering, for example. Furthermore, the dummy wiring pattern land 53 and the dummy pin terminal 32 are secured with each other by soldering or the like.

FIG. 2 shows a state where the motor 10 is disposed above the circuit board 30 by bending the FPC 50. Such installation of the motor 10 above the circuit board 30 leads to an increase in space utilization efficiency.

When making a connection between the FPC 50, which supplies electrical power to the motor 10, and the circuit board 30, the dummy pin terminal 32 and the dummy wiring pattern land 53 are disposed without electrical connection in addition to arrangement of the pin terminals 31 and the wiring pattern lands 52, which are electrically connected to the control circuit 20. Thus, load applied to the FPC 50 can be distributed not only to the pin terminals 31 and the wiring pattern lands 52 but also to the dummy pin terminal 32 and the dummy wiring pattern land 53 Therefore, it results in a further decrease in load to the pin terminals 31 and the wiring pattern lands 52. Thus, a motor control device 100 that allows a decrease in disconnection between the pin terminals 31 and the wiring pattern lands 52 can be obtained.

Furthermore, the dummy pin terminal 32 and the dummy wiring pattern land 53 are arranged so that they can be nearer than the pin terminals 31 and the wiring pattern lands 52 with respect to a side where the FPC 50 is drawn to the motor 10. Therefore, load transmitted to the FPC 50, which is caused by vibration of the motor 10, is mainly transmitted to the dummy pin terminal 32 and the dummy wiring pattern land 53 rather than transmitting to the pin terminals 31 and the wiring pattern lands 52. It results in a further decrease in load to the pin terminals 31 and the wiring pattern lands 52. Therefore, a motor control device 100 that allows a further decrease in disconnection between the pin terminals 31 and the wiring pattern lands 52 can be obtained.

Furthermore, the FPC holder holds one end of the FPC 50 connected to the motor 10, while the FPC holder is secured on the motor 10. Thus, the FPC 50 is prevented from shifting from its position with respect to the motor 10. Therefore, a motor control device 100 that allows a decrease in disconnection on the side of the motor 10 can be obtained.

Furthermore, the present invention is not limited to the embodiment described above. Alternatively, for example, two or more dummy pin terminals 32 and two or more dummy wiring pattern lands 53 may be disposed. In addition, an equal number of the dummy pin terminals 32 and the dummy wiring pattern lands 53 may be disposed, or may be disposed on both outer ends of terminal rows of the wiring pattern lands 52 and the pin terminals 31. In this case, a plurality of the dummy pin terminals 32 and a plurality of the dummy wiring pattern lands 53 can receive load to be applied to the FPC 50. It results in a further decrease in load to the pin terminals 31 and the wiring pattern lands 52. Therefore, a motor control device 100 that allows a further decrease in disconnection between the pin terminals 31 and the wiring pattern lands 52 can be obtained.

Furthermore, since the dummy pin terminal 32 and the dummy wiring pattern land 53 are disposed more outside than the pin terminals 31 and the wiring pattern lands 52, the pin terminal 31 and the wiring pattern land 52 can receive load against the both sides of the pin terminals 31 and the wiring pattern lands 52. It results in a further decrease in load to the pin terminals 31 and the wiring pattern lands 52. Therefore, a motor control device that allows a further decrease in disconnection between the pin terminals 31 and the wiring pattern lands 52 can be obtained.

Alternatively, the pin terminals 31 electrically connected to the control circuit 20 and the dummy pin terminal 32 electrically free therefrom may be embedded into the base 40 instead of embedding in the circuit board 30.

In this case, embedding both the pin terminals 31 and the dummy pin terminal 32 can be simultaneously performed as long as they are embedded into the base 40. Thus, compared with embedding into the circuit base board 30, it can easily decrease costs, and allows the pin terminals 31 and the dummy pin terminals 32 to be easily embedded. Furthermore, the circuit board 30 can be easily positioned on the base 40 to facilitate fabrication. Furthermore, compared with embedding into the circuit board 30, a further decrease in cost can be attained by producing the base 40 by insert-molding with resin and simultaneously embedding the pin terminals 31 and the dummy pin terminal 32 into the base 40. Furthermore, the present invention can be carried out with various modifications without departing from the gist thereof.

REFERENCE SIGNS LIST

10: motor, 11 and 31: pin terminal, 20: control circuit, 30: circuit board, 32: dummy pin terminal, 40: base, 50: flexible printed circuit (FPC), 51 and 52: wiring pattern land, 53: dummy wiring pattern land, 60: FPC holder, 61: main body, 62: terminal through-hole, 63: FPC through-hole, 64: bridging portion, 65: engaging portion, 100: motor controlling device, 510,520 and 530: hole

CITATION LIST

Patent Literature

Patent Literature 1: Japanese Unexamined Patent Application Publication No. 8-213721

The invention claimed is:

1. A motor control device, comprising:
a circuit board having a control circuit controlling electric power to be supplied to the motor;
a base fixedly supporting the circuit board;
a flexible printed circuit (FPC) supplying electric power to the motor, the FPC having a first end and second end;
a pin terminal disposed on the circuit board, being electrically connected with the control circuit and the first end of the FPC;
a dummy pin terminal disposed on the circuit board, being electrically free from the control circuit;
a wiring pattern land disposed on the FPC, being electrically connected with the pin terminal;
a dummy wiring pattern land disposed on the FPC, being connected with the dummy pin terminal; and
a FPC holder secured on the motor to hold the second end of the FPC to be connected to the motor, the FPC holder comprising:
a main body;
an engaging portion extended downwardly and outwardly from the main body to be secured on the motor; and
a bridging portion provided on the main body to form an FPC through-hole where the second end of the FPC is inserted therethrough.

2. The motor control device according to claim 1, wherein the dummy pin terminal and the dummy wiring pattern land are disposed between the pin terminal and the wiring pattern land, respectively, and a side of the FPC that extends to the motor.

3. The motor control device according to claim 1, further comprising:
a plurality of dummy pin terminals; and
a plurality of dummy wiring pattern lands equal in number to the plurality of dummy pin terminals.

4. The motor control device according to claim 1, wherein:
the dummy pin terminal and the pin terminal are arranged in a row on the circuit board, and the dummy wiring pattern land and the wiring pattern land are arranged in a row on the FPC; and
the dummy pin terminal is disposed on an end of the row on the circuit board, and the dummy wiring pattern is disposed on an end of the row on the FPC.

5. The motor control device according to claim 1, wherein each of the pin terminal and the dummy pin terminal are disposed on the base instead of the circuit board.

6. A motor control device, comprising:
a motor having a motor pin terminal;
a circuit board having a control circuit controlling electric power to be supplied to the motor;
a base fixedly supporting the circuit board;
a flexible printed circuit (FPC) supplying electric power to the motor, the FPC having a first end and a second end;
a pin terminal disposed on the base, being electrically connected with the control circuit and the first end of the FPC;
a dummy pin terminal disposed on the base, being electrically free from the control circuit;
a wiring pattern land disposed on the FPC, being electrically connected with the pin terminal;
a dummy wiring pattern land disposed on the FPC, being connected with the dummy pin terminal; and
a FPC holder secured on the motor to hold the second end of the FPC to be connected to the motor, comprising:
a main body having a terminal through-hole where the motor pin terminal is inserted therethrough;
an engaging portion extended downwardly and outwardly from the main body to be secured on the motor; and
a bridging portion provided on the main body to form an FPC through-hole where the second end of the FPC is inserted therethrough;
wherein the dummy pin terminal and the dummy wiring pattern land are disposed between the pin terminal and the wiring pattern land, respectively, and a side of the FPC that extends to the motor;
wherein the dummy pin terminal and the pin terminal are arranged in a row on the circuit board, the dummy wiring pattern land and the wiring pattern land are arranged in a row on the FPC, the dummy pin terminal is disposed on an end of the row on the circuit board, and the dummy wiring pattern is disposed on an end of the row on the FPC; and
wherein the second end of the FPC is inserted through the FPC through-hole and connected to the motor pin terminal inserted through the terminal through-hole.

\* \* \* \* \*